(12) United States Patent
Logan et al.

(10) Patent No.: US 6,946,710 B2
(45) Date of Patent: Sep. 20, 2005

(54) METHOD AND STRUCTURE TO REDUCE CMOS INTER-WELL LEAKAGE

(75) Inventors: Lyndon R. Logan, Essex Junction, VT (US); James A. Slinkman, Montpelier, VT (US)

(73) Assignee: International Business Machines Corporation, Armonk, NY (US)

(*) Notice: Subject to any disclaimer, the term of this patent is extended or adjusted under 35 U.S.C. 154(b) by 22 days.

(21) Appl. No.: 10/687,295

(22) Filed: Oct. 16, 2003

(65) Prior Publication Data

US 2004/0166620 A1 Aug. 26, 2004

Related U.S. Application Data

(62) Division of application No. 09/803,117, filed on Mar. 10, 2001, now Pat. No. 6,686,252.

(51) Int. Cl.$^7$ ............................................. H01L 29/772
(52) U.S. Cl. ....................................................... 257/372
(58) Field of Search ................................ 257/288, 368, 257/369, 372, 487, 490, 509, 510, 511, 519; 438/221, 424, 433, 524

(56) References Cited

U.S. PATENT DOCUMENTS

| | | |
|---|---|---|
| 5,770,504 A | 6/1998 | Brown et al. |
| 5,861,330 A | 1/1999 | Baker et al. |
| 6,033,949 A | 3/2000 | Baker et al. |
| 6,054,344 A | 4/2000 | Liang et al. |
| 6,069,057 A | 5/2000 | Wu |
| 6,177,333 B1 | 1/2001 | Rhodes |
| 6,228,726 B1 | 5/2001 | Liaw |
| 6,248,645 B1 | 6/2001 | Matsuoka et al. |
| 6,313,011 B1 | 11/2001 | Nouri |
| 6,342,429 B1 | 1/2002 | Puchner et al. |
| 6,472,301 B1 | 10/2002 | Lin et al. |

*Primary Examiner*—Carl Whitehead, Jr.
*Assistant Examiner*—Jennifer M. Dolan
(74) *Attorney, Agent, or Firm*—Schmeiser, Olsen & Watts; William Sabo (57) ABSTRACT

A method of forming a semiconductor device with improved leakage control, includes: providing a semiconductor substrate; forming a trench in the substrate; forming a leakage stop implant in the substrate under the bottom of the trench and under and align to a sidewall of the trench; filling the trench with an insulator; and forming an N-well (or a P-well) in the substrate adjacent to and in contact with an opposite sidewall of the trench, the N-well (or the P-well) extending under the trench and forming an upper portion of an isolation junction with the leakage stop implant, the upper portion of the isolation junction located entirely under the trench. The leakage control implant is self-aligned to the trench sidewalls.

26 Claims, 11 Drawing Sheets

METHOD AND STRUCTURE TO REDUCE CMOS INTER-WELL LEAKAGE

REFERENCE TO RELATED APPLICATION

This application is a divisional of Application Ser. No. 09/803,117, filed Mar. 10, 2001 now U.S. Pat. No. 6,686,252.

FIELD OF THE INVENTION

The present invention relates to the field of semiconductor integrated circuits; more specifically, it relates to a structure for reducing shallow trench isolation (STI) bound inter-well leakage in complementary metal oxide semiconductor (CMOS) technology and the method of fabricating said structure.

BACKGROUND OF THE INVENTION

Bulk CMOS technologies that utilize STI can be susceptible to leakage currents between the N-well or the P-well and adjacent diffusions or the substrate that the STI attempts to isolate. STI is formed by etching a trench from the surface of a substrate a predetermined depth into the substrate and then filling the trench with an insulator. Inter-well leakage is a key design issue that affects the degree to which performance-influencing parameters such as junction capacitance can be optimized. Inter-well leakage can cause latch-up, high standby current and high power dissipation. Inter-well leakage becomes increasingly important as the design ground-rules for STI shrink in response to increased device density.

Figure 1:
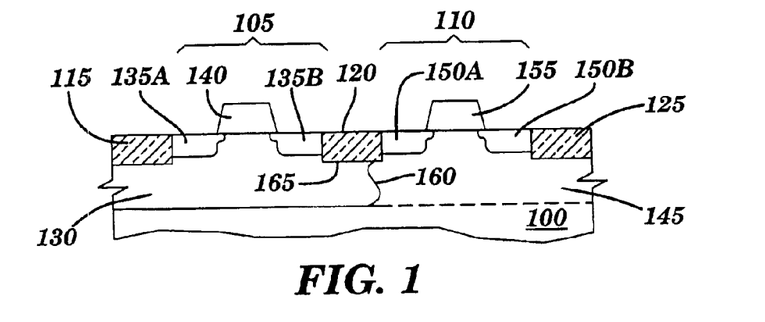
FIG. 1 is a partial cross-section view through a typical pair of CMOS devices.

Turning to FIG. 1, FIG. 1 is a partial cross-section view through a typical pair of CMOS devices. Fabricated on a substrate 100 are a PFET 105 and an NFET 110. PFET 105 is bounded by a first STI 115 and a second STI 120. NFET 110 is bounded by second STI 120 and a third STI 125. PFET 105 is fabricated in an N-well 130 and comprises source/drains 135A, 135B, and a gate 140. NFET 110 is fabricated in a P-well 145 and comprises source/drains 150A, 150B, and a gate 155. An isolation junction 160 is formed between N-well 130 and P-well 145 and extends up to a bottom surface 165 of second STI 120. Isolation junction 160 and second STI 120 provide for isolation of PFET 105 and NFET 110.

Figures 2A, 2B:
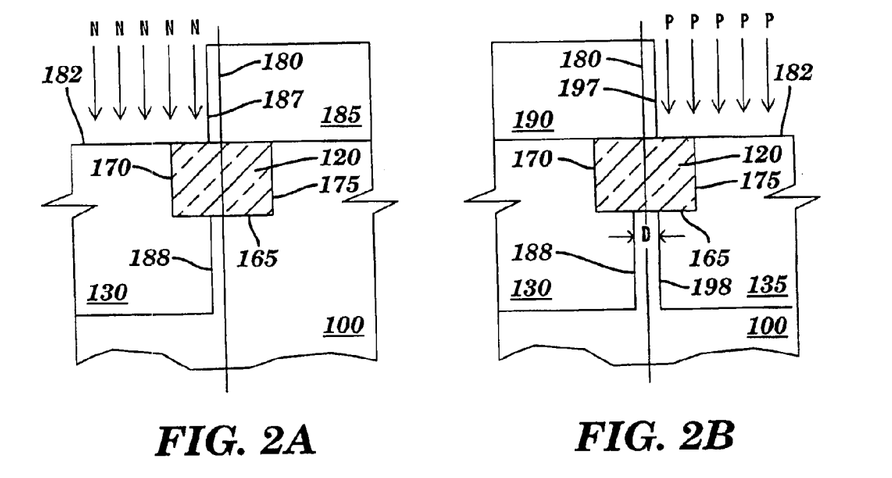
FIGS. 2A and 2B are partial cross section views illustrating one method of forming of an N-well and a P-well in CMOS technology.

FIGS. 2A and 2B are partial cross section views illustrating one method of forming an N-well and a P-well in CMOS technology. In FIG. 1, second STI 120 is formed in substrate 100. Second STI 120 has in addition to bottom surface 165, a first sidewall 170 and a second sidewall 175. Second STI 120 is bisected by a reference plane 180, which is equidistant from first and second sidewalls 170 and 175 and perpendicular to a top surface 182 of substrate 100. N-well 130 is formed by implantation of N dopant atoms using a first resist mask 185 as an implantation mask. First resist mask 185 has a sidewall 187 formed on top of second STI 120 and between reference plane 180 and first sidewall 170 of the second STI. After implant, a sidewall 188 of N-well 130 is located under second STI 120 and between reference plane 180 and first sidewall 170 of the second STI.

In FIG. 2B, P-well 145 is formed by implantation of P dopant atoms using a second resist mask 190 as an implantation mask. Second resist mask 190 has a sidewall 197 formed on top of second STI 120 and between reference plane 180 and second sidewall 175 of the second STI. After implant, a sidewall 198 of P-well 145 is located under STI 120 and between reference plane 180 and second sidewall 175 of the second STI. Sidewall 188 of N-well 130 is separated from sidewall 198 of P-well 145 by distance "D". After subsequent process steps, especially heat cycles, sidewall 188 of N-well 130 and sidewall 198 of P-well 145 merge due to dopant diffusion to form isolation junction 160 as illustrated in FIG. 1 and described above. Generally, the N-well and P-well implants are not necessarily performed directly on surface 182 of substrate 100, but through an intervening layer, which may comprise silicon oxide, silicon nitride, or a combination thereof, formed on the surface of the substrate, which layer has not been included in FIGS. 2A and 2B.

Figure 3:
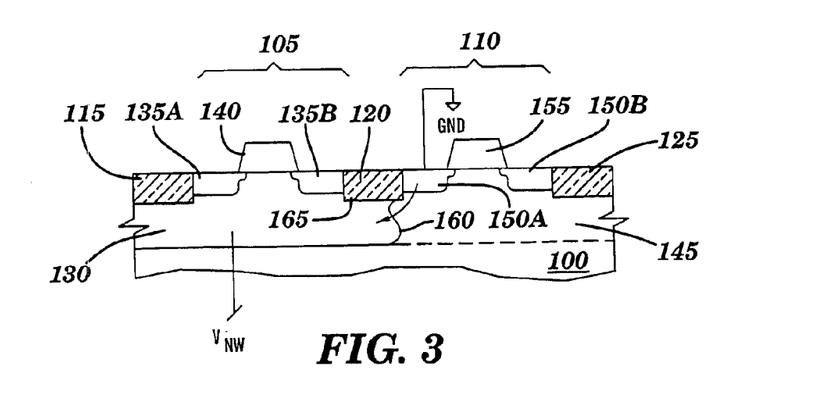
FIG. 3 is a partial cross-section view through a typical pair of CMOS devices illustrating a leakage path between the P-well device and the N-well.

FIG. 3 is a partial cross-section view through a typical pair of CMOS devices illustrating a leakage path between the P-well device and the N-well. Non-perfect or misalignment of first and/or second resist masks 185 and 190 will cause isolation junction 160 to shift further toward NFET 110 and result in increased inter-well leakage. The leakage path is from grounded source/drain 150A of NFET 110 to N-well 130 held at $V_{NW}$. In one example, $V_{NW}$ is about 0 to 2.5 v. As the width of second STI 120 decreases, the percent the total width of the second STI used by alignment tolerances increases, so even acceptable alignment can result in unacceptable inter-well leakage. Decrease in the depth of second STI 120 also increases inter-well leakage.

Accordingly, a method to control inter-well leakage as STI width and depth ground-rules decrease is required.

SUMMARY OF THE INVENTION

A first aspect of the present invention is a method of forming a semiconductor device with improved leakage control, comprising: providing a semiconductor substrate having a top surface; forming a trench in the substrate, the trench having a bottom, a first sidewall and an opposite second sidewall; forming a leakage stop implant in the substrate under the bottom of the trench and under and aligned to the second sidewall; filling the trench with an insulator; and forming an N-well in the substrate adjacent to and in contact with the first sidewall, the N-well extending under the trench and forming an upper portion of an isolation junction with the leakage stop implant, the upper portion of the isolation junction located entirely under the trench.

A second aspect of the present invention is a method of forming a semiconductor device with improved leakage control, comprising: providing a P doped semiconductor substrate having a top surface; forming a trench in the substrate, the trench having a bottom, a first sidewall and an opposite second sidewall; forming a conformal modulating layer on the top surface of the substrate and on the bottom and first and second sidewalls of the trench; forming a leakage stop implant in the substrate under the bottom of the trench and under and aligned to the second sidewall; filling the trench with an insulator; and forming an N-well in the substrate adjacent to and in contact with the first sidewall, the N-well extending under the trench and forming an upper portion of an isolation junction with the leakage stop implant, the upper portion of the isolation junction located entirely under the trench.

A third aspect of the present invention is a semiconductor device with improved leakage control, comprising: a P doped semiconductor substrate having a top surface; a STI in the substrate, the STI having a bottom, a first sidewall and an opposite second sidewall; a leakage stop implant in the substrate under the bottom of the STI and under and aligned to the second sidewall; and an N-well in the substrate adjacent to and in contact with the first sidewall, the N-well extending under the STI and forming an upper portion of an isolation junction with the leakage stop implant, the upper portion of the isolation junction located entirely under the STI.

A fourth aspect of the present invention is a method of forming a semiconductor device with improved leakage control, comprising: providing a semiconductor substrate having a top surface; forming a trench in the substrate, the trench having a bottom, a first sidewall and an opposite second sidewall; forming a leakage stop implant in the substrate under the bottom of the trench and under and aligned to the second sidewall; filling the trench with an insulator; and forming a P-well in the substrate adjacent to and in contact with the first sidewall, the P-well extending under the trench and forming an upper portion of an isolation junction with the leakage stop implant, the upper portion of the isolation junction located entirely under the trench.

A fifth aspect of the present invention is a method of forming a semiconductor device with improved leakage control, comprising: providing an N doped semiconductor substrate having a top surface; forming a trench in the substrate, the trench having a bottom, a first sidewall and an opposite second sidewall; forming a conformal modulating layer on the top surface of the substrate and on the bottom and first and second sidewalls of the trench, the modulating layer having a outer surface; forming a leakage stop implant in the substrate under the bottom of the trench and under and aligned to the outer surface of the modulating layer on the second sidewall; filling the trench with an insulator; and forming a P-well in the substrate adjacent to and in contact with the first sidewall, the P-well extending under the trench and forming an upper portion of an isolation junction with the leakage stop implant, the upper portion of the isolation junction located entirely under the trench.

A sixth aspect of the present invention is a semiconductor device with improved leakage control, comprising: an N doped semiconductor substrate having a top surface; a STI in the substrate, the STI having a bottom, a first sidewall and an opposite second sidewall; a leakage stop implant in the substrate under the bottom of the STI and under and aligned to the second sidewall; and a P-well in the substrate adjacent to and in contact with the first sidewall, the P-well extending under the STI and forming an upper portion of an isolation junction with the leakage stop implant, the upper portion of the isolation junction located entirely under the STI.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The present invention describes a method in which a local field implant is introduced into the critical area under the STI that determines the inter-well leakage. The implant is controlled so as not to introduce other leakage paths while reducing the NFET source/drain to N-well leakage. Further, the method does not produce excess parasitic capacitance.

Figure 4A:
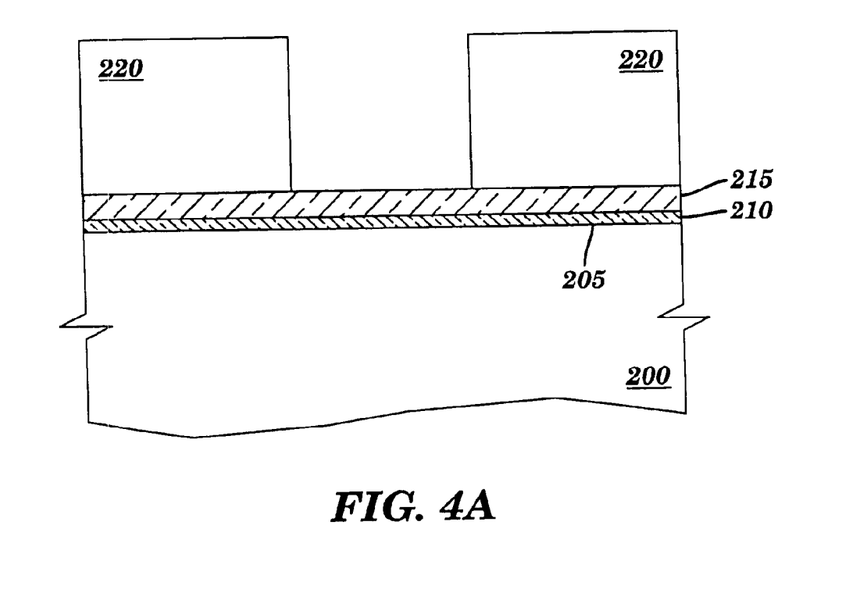
FIGS. 4A through 4J are partial cross section views illustrating fabrication of a CMOS device according to the present invention.

Referring to the drawings, FIGS. 4A through 4J are partial cross section views illustrating fabrication of a CMOS device according to the present invention. In FIG. 4A, a substrate 200 has a top surface 205. Formed on top surface 205 of substrate 200 is first oxide layer 210. Formed on top of first oxide layer 210 is first nitride layer 215. First oxide layer 210 may be formed by oxidation or deposition. First nitride layer 215 may be formed by deposition. Formed on top of first nitride layer 215 is first resist mask 220.

Figure 4B:
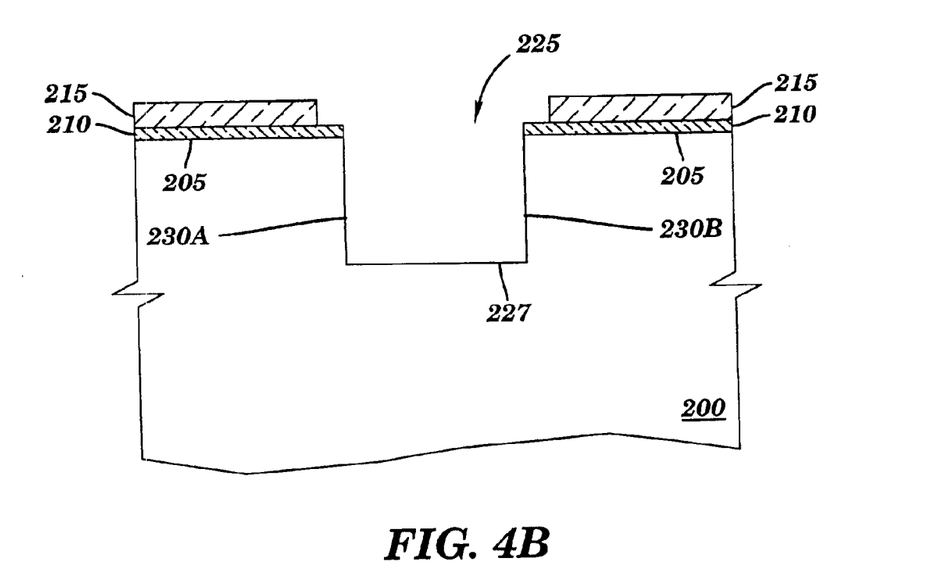

In FIG. 4B, first nitride layer 215 and first oxide layer 210 have been etched and a trench 225 has been formed in substrate 200. In one example the process sequence is to plasma etch first nitride layer 215 using a chlorine based chemistry, followed by removing first resist layer 220 and wet or plasma etching first oxide layer 110, followed by plasma etching substrate 200 using a chlorine based chemistry. During the silicon plasma etch there is etch back of first nitride layer 215. Trench 225 has a bottom 227, a first sidewall 230A and a second sidewall 230B. First nitride layer 215 is used as a chemical-mechanical-polish (CMP) stop in subsequent processing steps.

Figure 4C:
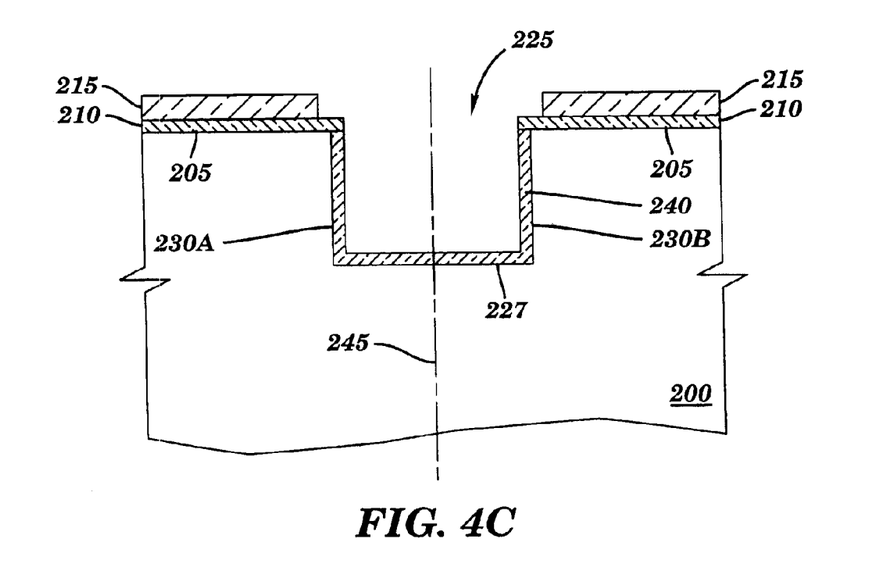

In FIG. 4C A liner 240 is formed on bottom 227, first sidewall 230A and a second sidewall 230B of trench 225. Trench 225 is bisected by a reference plane 245, which is equidistant from first and second sidewalls 230A and 230B and perpendicular to top surface 205 of substrate 200. In one example, substrate 200 is P doped to a concentration of about 1E15 atm/cm$^3$ to 1E16 atm/cm$^3$, trench 225 is about 0.25 to 0.4 micron deep and about 0.4 to 5 microns wide, first oxide layer 210 is about 8 to 12 nm thick, first nitride layer 215 is about 50 to 200 nm thick and liner 240 is about 10 to 30 nm thick thermal oxide. In a second example trench 225 is about 0.05 to 1 micron deep and about 0.1 to 5 microns wide.

Figure 4D:
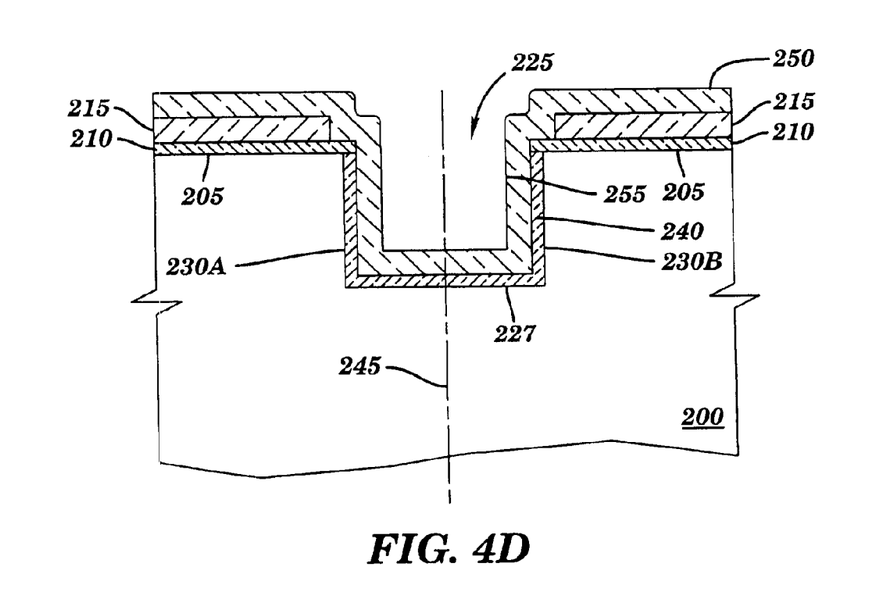

In FIG. 4D, a conformal second nitride layer 250 is deposited on top of first nitride layer 215, exposed regions of first oxide layer 210, and liner 240 which covers bottom 227, first sidewall 230A and second sidewall 230B of trench 225. Second nitride layer 250 may be formed by deposition. Second nitride layer 250 has a outer surface 255. In one example second nitride layer 250 is about 40 to 120 nm thick.

Figure 4E:
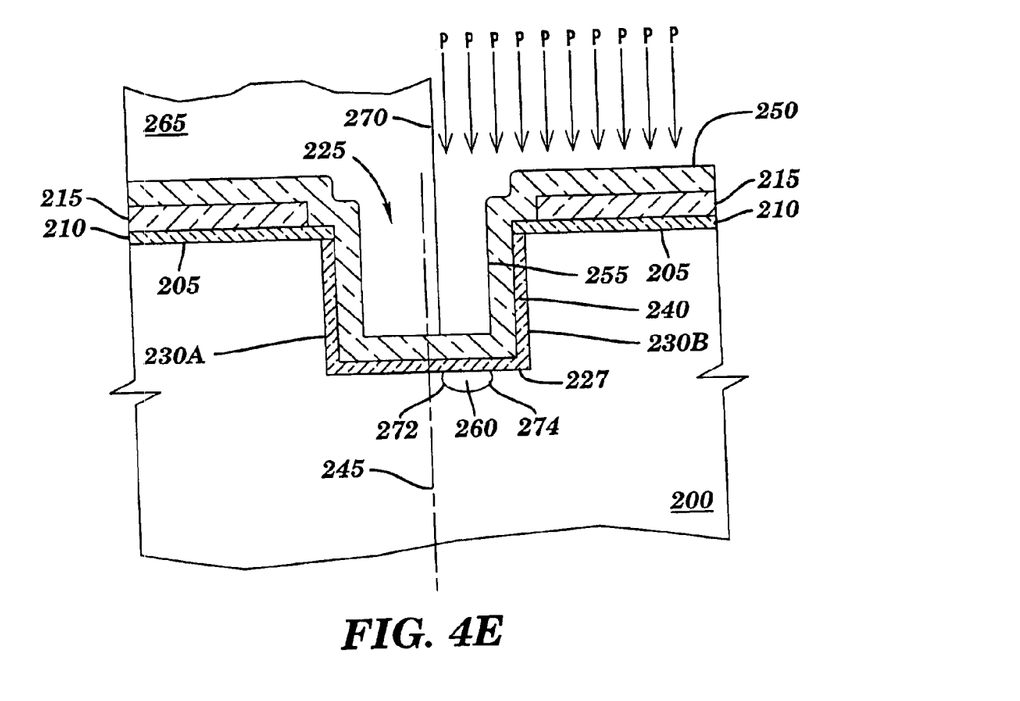

In FIG. 4E, a leakage stop implant 260 is formed by implantation of P dopant atoms using a second resist mask 265 as an implantation mask. Second resist mask 265 has a sidewall 270 formed on top of second nitride layer 250 in trench 210 and between reference plane 245 and outer surface 255 of second nitride layer 250. The portion of second nitride layer 250 on liner 240 of trench 225 acts to modulate the depth and lateral distance of leakage stop implant 260 from the second sidewall of the trench. In one example, the leakage stop implantation step implants boron at a dose of about 2.5E12 to about 5E12 atm/cm2 and an energy of about 20 to 40 Kev to produce a maximum implant depth of about 80 to 120 nm below bottom 27 of trench 225. In another example, the leakage stop implantation step implants boron diflouride at a dose of about 2.5E12 to about 5E12 atm/cm2 and an energy of about 80 to 180 Kev. In still another example, the leakage stop implantation step implants indium at a dose of about 2.5E12 to about 5E12 atm/cm2 and an energy of about 160 to 340 Kev. The width of leakage stop implant 260 is determined by sidewall 270 of first resist mask 265 on a first side 272 and by outer surface 255 of second nitride layer 250 on a second side 274. Since, as mentioned above, second nitride layer is conformal, leakage stop implant 270 is effectively self-aligned to second sidewall 210B of trench 210.

Figure 4F:
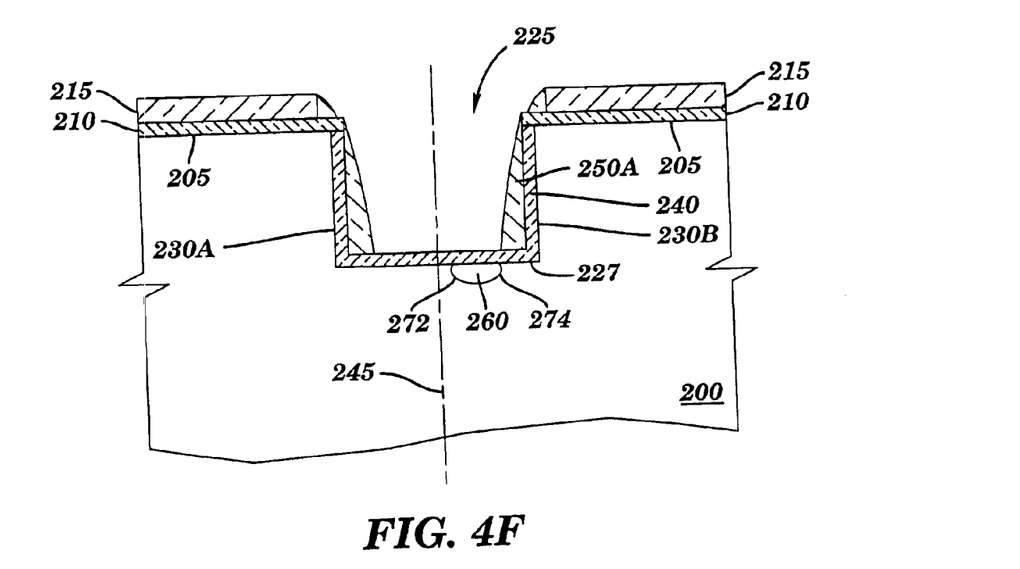

In FIG. 4F, second resist mask 265 is removed and second nitride layer 250 etched by reactive ion etching (RIE) until substantially all of the second nitride layer is removed from on top of first nitride layer 215 and bottom 227 of trench 225. The RIE step leaves liner 240 exposed at bottom 227 of trench 225 and forms a nitride spacer 250A over the oxide liner on first and second sidewalls 230A and 230B. Second nitride layer 250 is removed so as not to interfere with subsequent processing steps, especially CMP of the trench fill and the N-well and P-well implants.

Figure 4G:
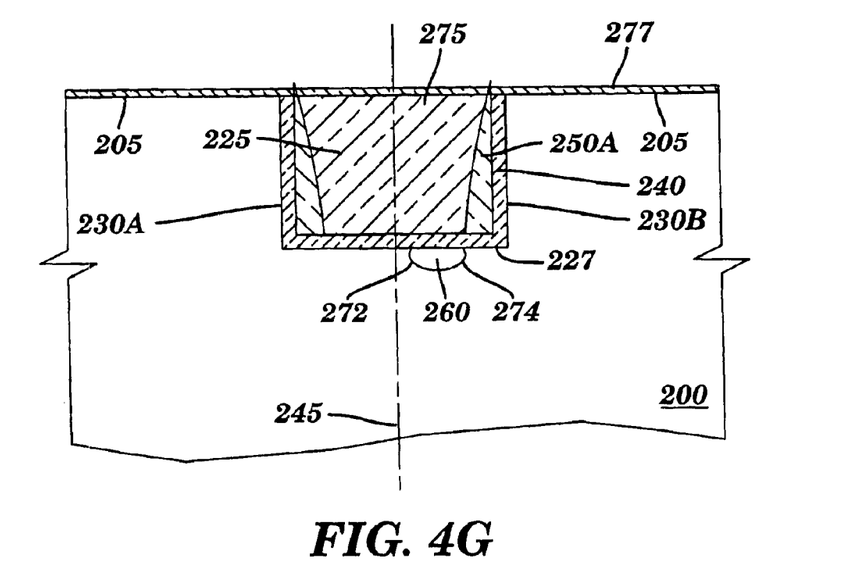

In FIG. 4G, trench 225 is filled with an insulator, such as a silicon oxide formed by plasma CVD using tetraethyl orthosilicate (TEOS) or a high-density plasma (HDP) oxide to form STI 275. Trench fill is accomplished by a blanket deposition of the insulator followed by a CMP step. First oxide layer 210 and first nitride layer 215 are then removed and second oxide layer 277 formed. Second oxide layer 277 may be formed by oxidation or deposition. Second oxide layer protects top surface 205 of substrate 200 from implant damage and contamination in subsequent processing steps. In one example, second oxide layer is about 5 to 30 nm thick.

Figure 4H:
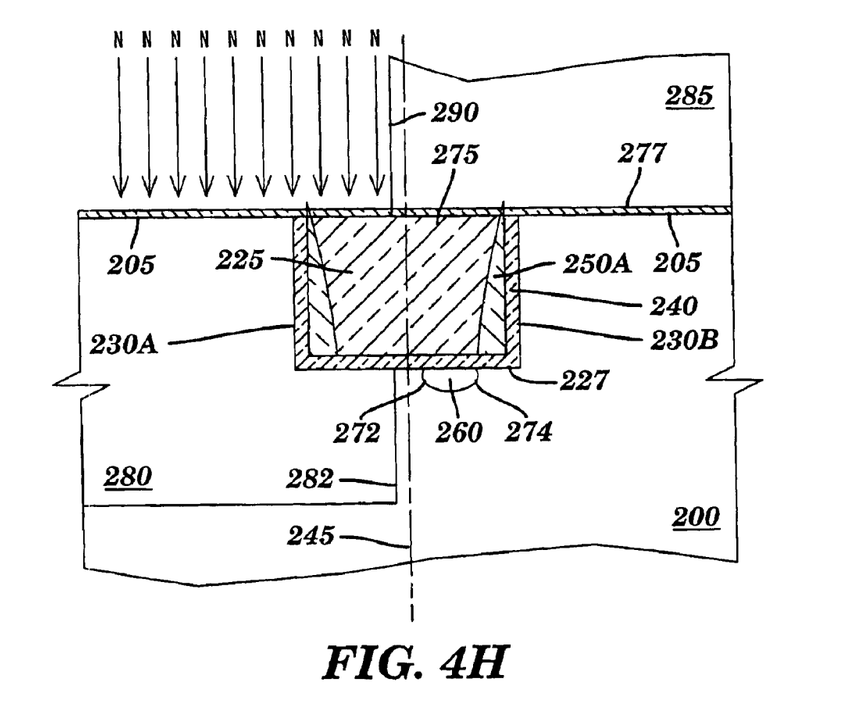

In FIG. 4H, an N-well 280 is formed by implantation of N dopant atoms using a third resist mask 285 as an implantation mask. Third resist mask 285 has a sidewall 290 formed on top of second oxide layer 277 over STI 275 and between reference plane 245 and first sidewall 230A of now filled trench 225. After implant, a sidewall 282 of N-well 280 is located under now filled trench 225 and between reference plane 245 and first sidewall 210A of the filled trench. In one example, N-well 280 extends from top surface 205 of substrate 200 to about 0.8 to 1.0 micron below the surface of the substrate. After the implantation step, third resist mask 285 is removed.

Figure 4I:
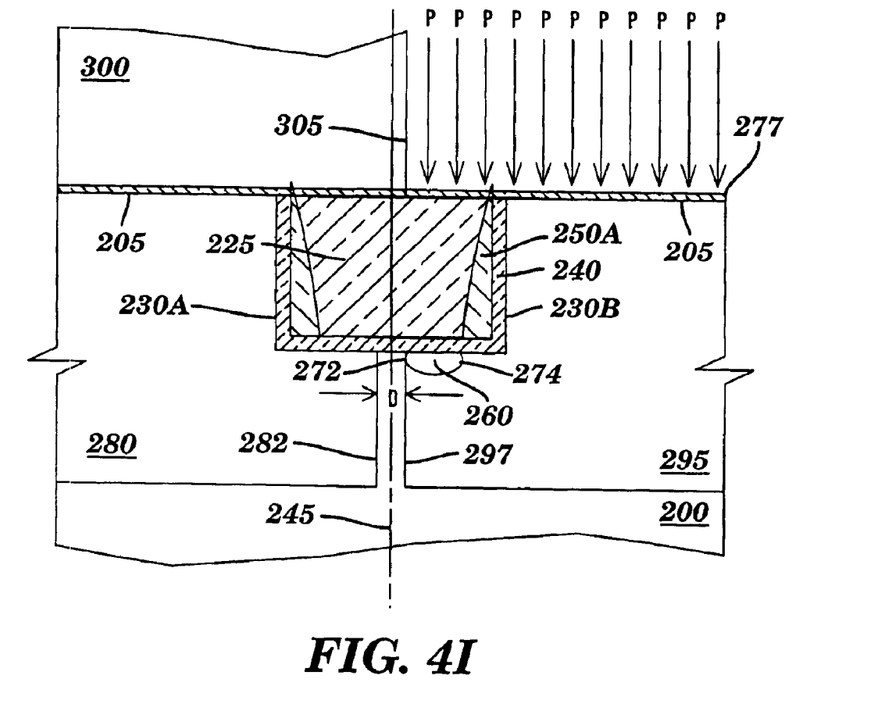

The process step illustrated in FIG. 4I is optional, but generally required for the fabrication of advanced CMOS devices where it is necessary to tailor the P dopant concentration in the bulk silicon of the NFET device. In FIG. 4I, a P-well 295 is formed by implantation of P dopant atoms using a fourth resist mask 300 as an implantation mask. Fourth resist mask 300 has a sidewall 305 formed on top of second oxide layer 277 over STI 275 and between reference plane 245 and second sidewall 240 of now filled trench 225. After implant, a sidewall 297 of N-well 295 is located under now filled trench 225 and between reference plane 245 and second sidewall 240 of the filled trench. In one example, P-well 295 extends from top surface 205 of substrate 200 to about 0.8 to 1.0 micron below the surface of the substrate. After the implantation step, fourth resist mask 300 is removed. In the present example, sidewall 282 of N-well 280 is separated from sidewall 297 of P-well 295 by distance "D" where "D" is about 0.1 to 0.2 micron. However, dependent upon alignment of fourth resist 300, there may not be any separation between sidewall 297 of P-well 295 and the N-well 280 and the P-well may even overlap the N-well. The same photomask used to pattern second resist mask 265 may be used to pattern fourth resist mask 300.

Figure 4J:
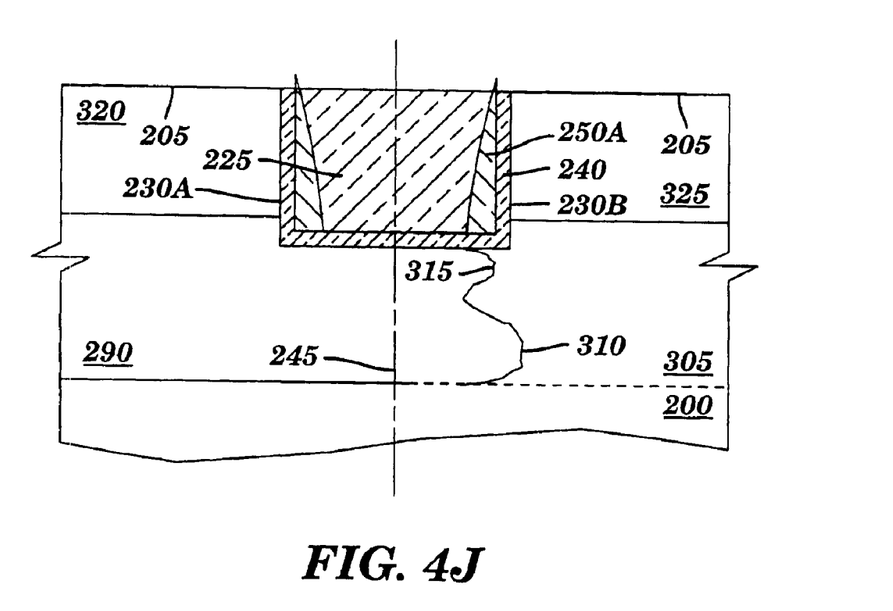

FIG. 4J illustrates formation of isolation junction 310 after subsequent process steps, especially heat cycles, from sidewall 282 of N-well 280 and sidewall 297 of P-well 295. It should be noticed that isolation junction 310 exhibits a protrusion 315 of P dopant in contact with and under now filled trench 225 and extending from second sidewall 240 of the filled trench toward reference plane 245. Protrusion 315 results from leakage stop implant 260 increasing the concentration of P dopant in that region of P-well 305. The effect of protrusion 315 is to increase length of the leakage path from source/drain 325 to N-well 290. Also shown in FIG. 4H is a source/drain 320 of a PFET device formed in N-well 290 and a source/drain 325 of an NFET device formed in P-well 305.

Figure 5:
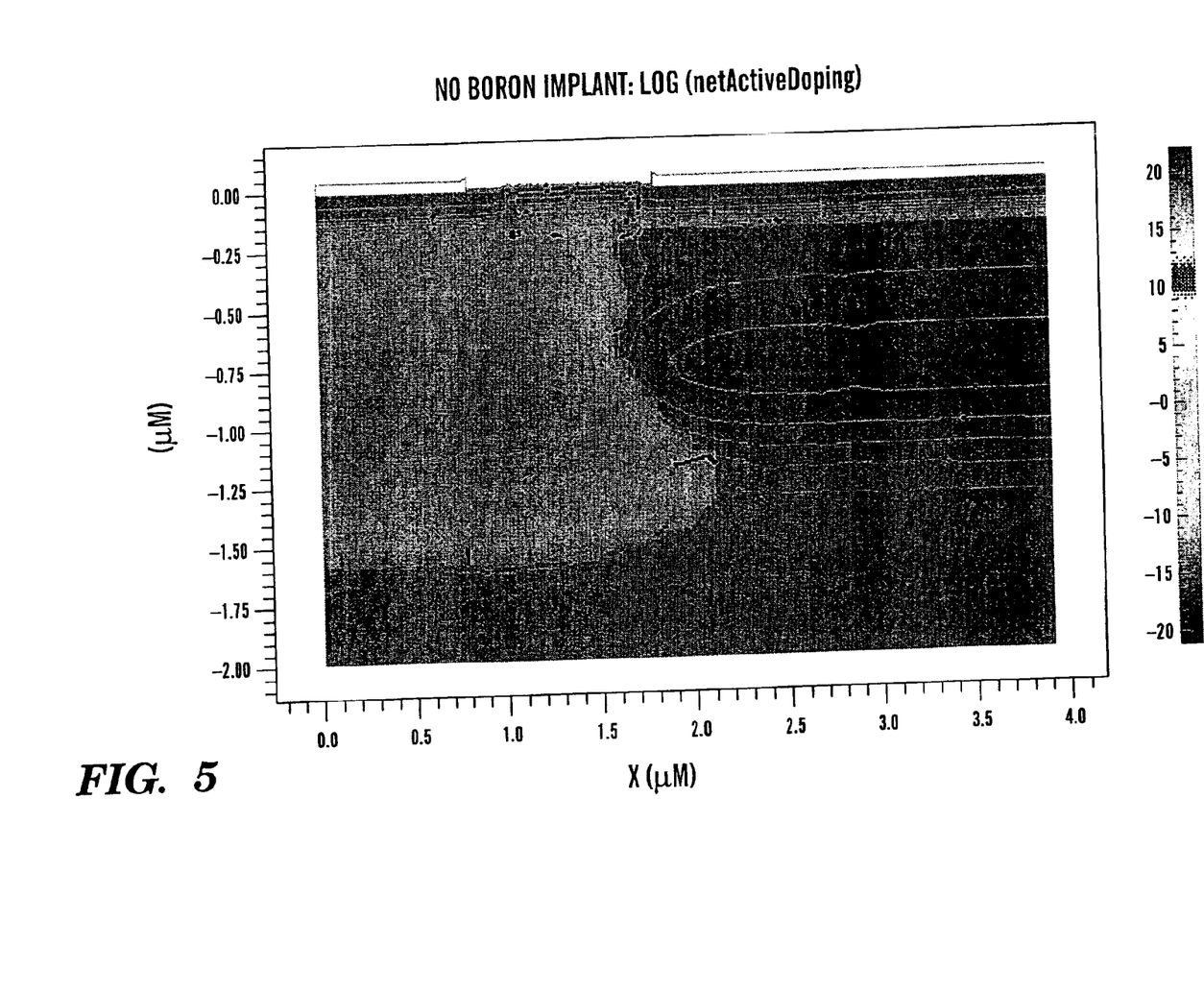
FIG. 5 is a computer-simulated cross section of the doping profile of the N and P wells near the STI of the related art.
Figure 9:
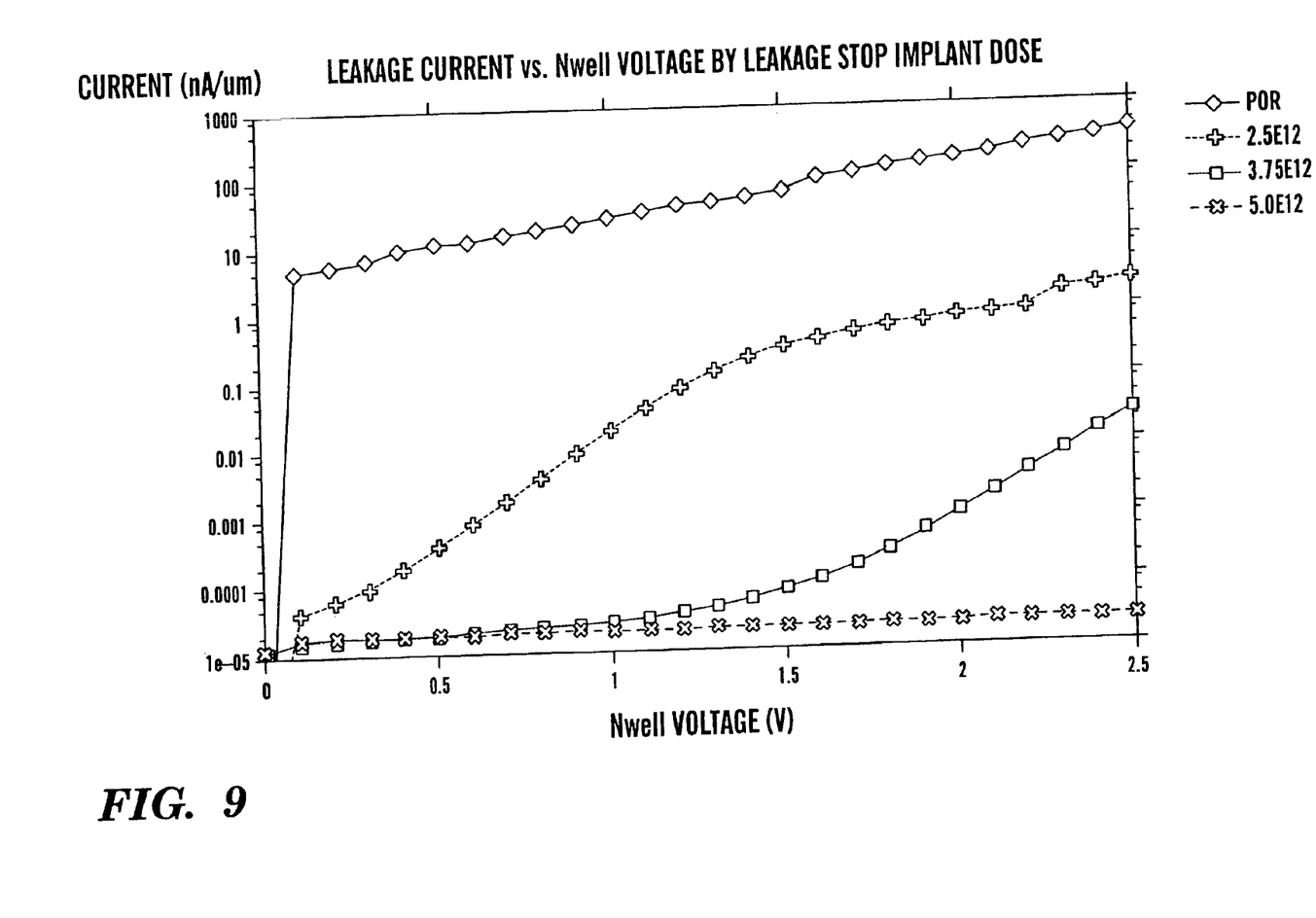
FIG. 9 is a plot of leakage current vs. N-well voltage by leakage stop implant dose according to the present invention for the structure illustrated in FIGS. 6 and 7.

FIG. 5 is a computer-simulated cross section of the doping profile of the N and P wells near the STI of the related art. In FIG. 5 the N-well is on the left side of FIG. 5 and extends to a depth of Y=−1.6 microns. The P-well is on the right side of FIG. 5. The STI is visible between X=1.0 and X=1.7 microns (PFET source/drain 135B-second STI 120-NFET source/drain 150A of FIG. 3) with the bottom of the STI at Y=−0.2 micron. Small values for STI depth and width are used in the simulation in order to maximize the probability of N-well leakage. The N-well leakage is shown in FIG. 9. There is no leakage stop implant. The P-well extends only as far X=1.65 or about 7% of the width of the STI.

Figure 6:
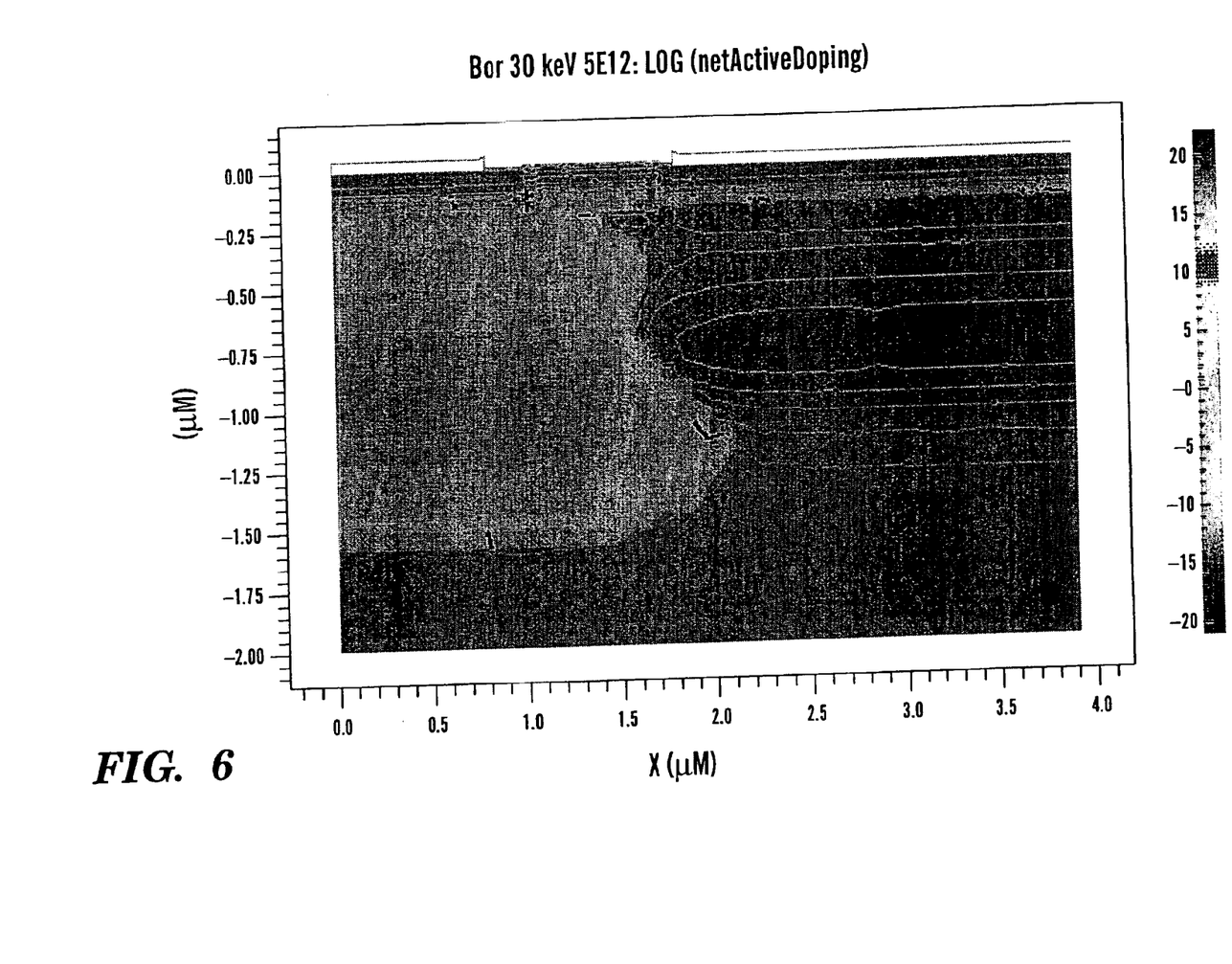
FIG. 6 is a computer-simulated cross section of the doping profile of the N-well and P-well near the STI according to the present invention.

FIG. 6 is a computer-simulated cross section of the doping profile of the N-well and P-well near the STI according to the present invention. In FIG. 6 the N-well is on the left side of FIG. 6 and extends to a depth of Y=−1.6 microns. The P-well is on the right side of FIG. 6. The STI is visible between X=1.0 and X=1.7 microns with a depth of Y=−0.2 micron. Small values for STI depth and width are used in the simulation in order to maximize the probability of N-well leakage. The N-well leakage is shown in FIG. 9. The leakage stop implant is visible under the STI and extends from the P-well as far as X=1.44 or about 37% of the width of the STI. Thus, P dopant extends over 5 times further under the STI when a leakage stop implant is performed then when there is no leakage stop implant. The leakage stop implant used in the simulation is 5E12 atm/cm$^2$ at 30 Kev.

Figure 7:
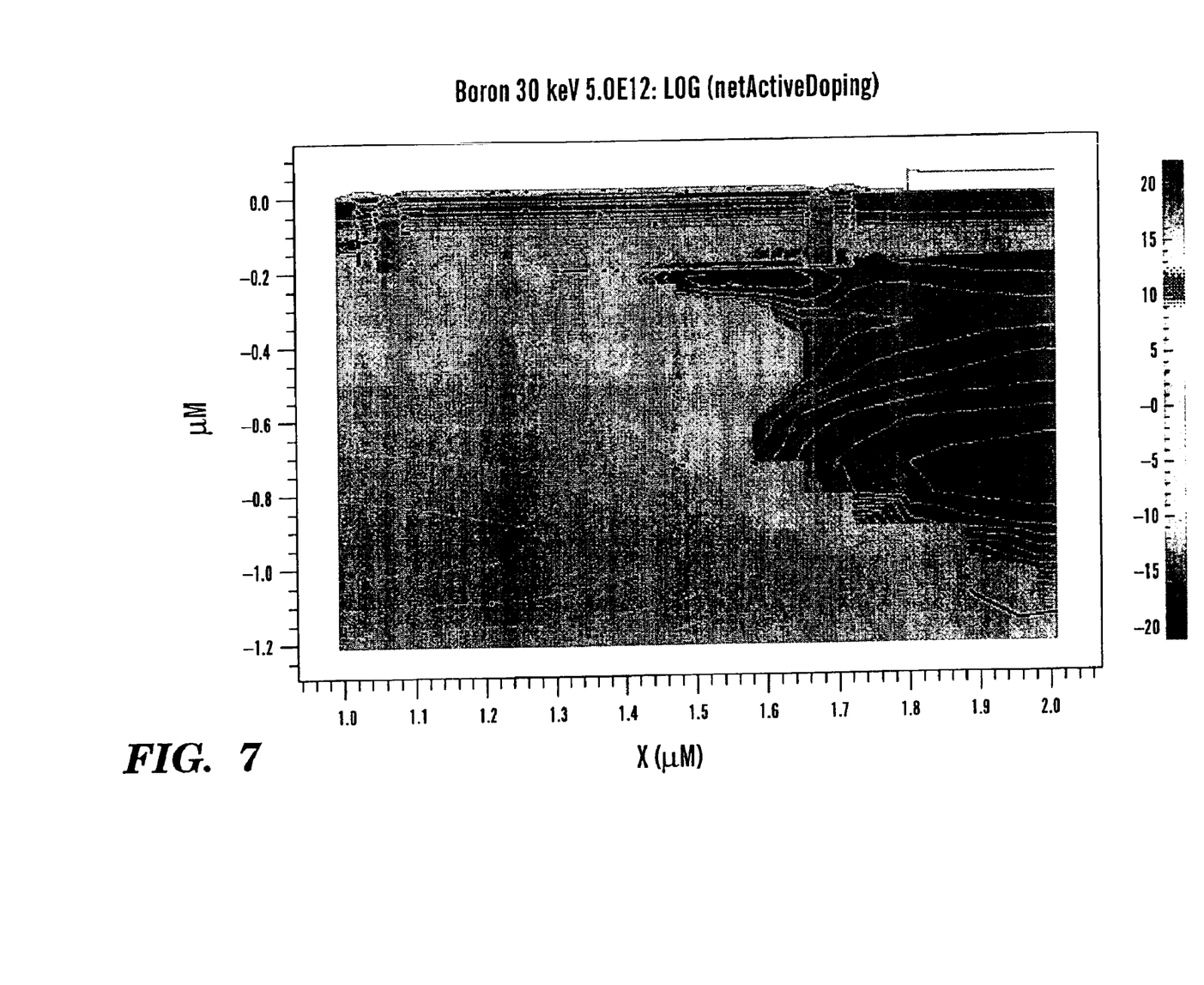
FIG. 7 is a higher magnification view of the computer-simulated cross section of the doping profile of the N-well and P-well near the STI of FIG. 6 according to the present invention.

FIG. 7 is a higher magnification view of the computer-simulated cross section of the doping profile of the N-well and P-well near the STI of FIG. 6 according to the present invention. In FIG. 7, simulated nitride spacers are visible at X=1.06 to X=1.075 microns (first spacer) and at X=1.66 to X=1.75 microns (second spacer). The leakage stop implant extends to Y=−0.35 micron or 0.15 micron under the STI.

Figure 8:
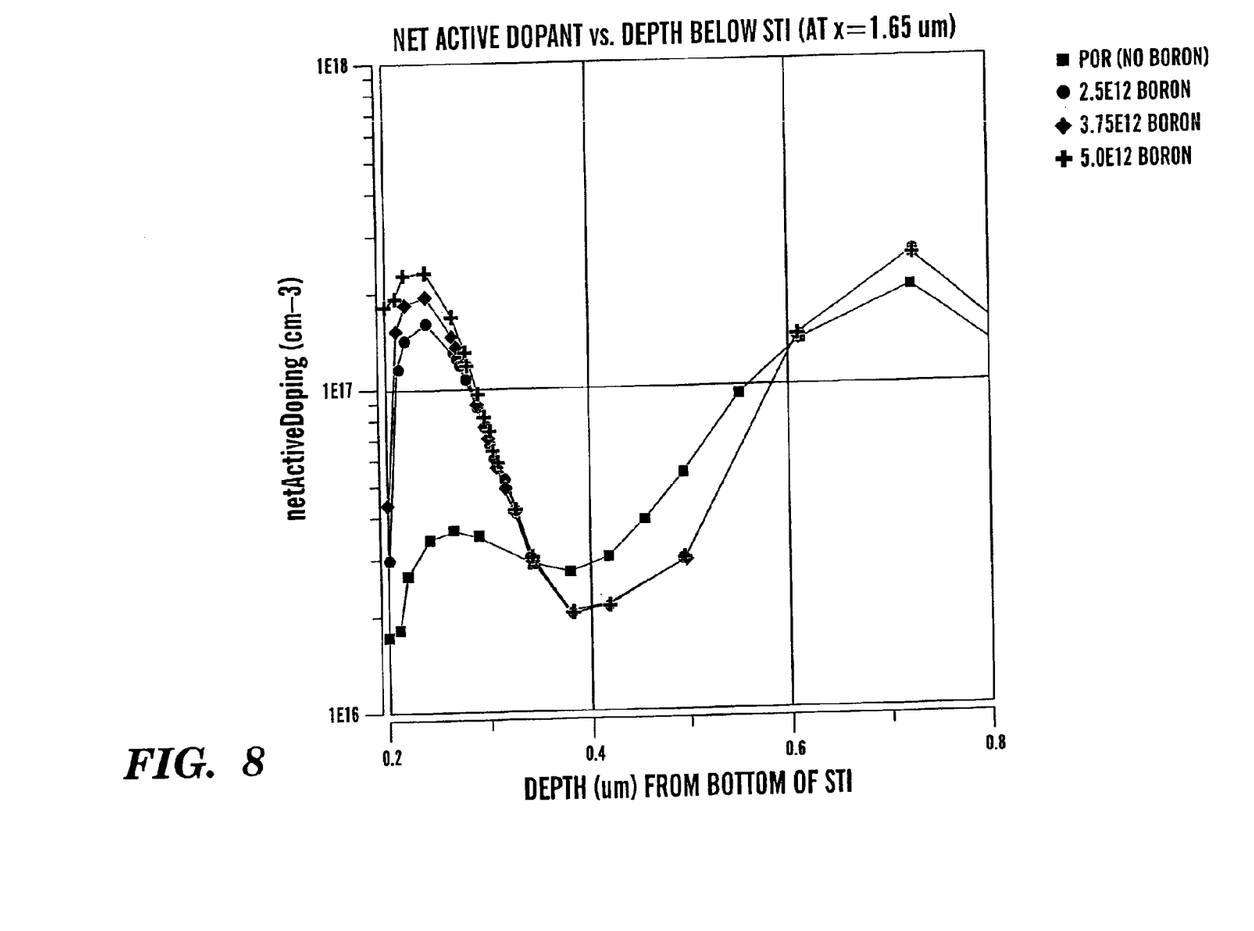
FIG. 8 is a computer-simulated plot of the net active dopant vs. depth below the STI according to the present invention.

FIG. 8 is a computer-simulated plot of the net active dopant vs. depth below the STI according to the present invention. Profiles of no boron, 2.5E12 atm/cm$^2$ boron, 3.75E12 atm/cm$^2$ boron and 5E12 atm/cm$^2$ boron are shown. All implants are at 30 Kev. The profiles are calculated at X=1.65 in FIG. 7. At the silicon/STI interface X=0.2 the concentration of boron without a leakage stop implant is less than $1.1E16$ atm/cm$^3$. With a leakage stop implant the concentration of boron at the silicon/STI interface ranges from $3E16$ atm/cm$^3$ for a dose of $2.5E12$ atm/cm$^2$ to just under $1E17$ atm/cm$^3$ for a dose of $5E12$ atm/cm$^2$. For the latter case this is over ten times the surface concentration of boron vs. the no leakage implant case. At about 0.1 micron below the STI (X=0.3) the concentration of boron without a leakage stop implant is about $1.35E16$ atm/cm$^3$. With a leakage stop implant the concentration of boron at 0.1 micron below the STI ranges from about $1.07E17$ atm/cm$^3$ for a dose of $2.5E12$ atm/cm$^2$ to about $1.14E17$ atm/cm$^3$ for a dose of $5E12$ atm/cm$^2$. For the latter case this is over eight times the concentration of boron vs. the no leakage implant case.

From FIGS. 5, 6, 7 and 8 it is clear that the leakage stop implant has a significant effect on the isolation junction profile and P-well doping concentration under the STI.

FIG. 9 is a plot of leakage current vs. N-well voltage by leakage stop implant dose according to the present invention for the structure illustrated in FIGS. 6 and 7. The total resulting current per 1-micron wide STI unit is plotted for a voltage ramp from 0 to 2.5 volts. Any leakage above 0.1 nA/um is considered unacceptable. With no leakage stop implant, a leakage of about 9 nA/micron at about 0.1 volt is evident. With a 30 Kev, 2.5E12 atm/cm2 boron dose, unacceptable leakage is prevented at up to about 1 volt. A 30 Kev, 3.75E12 atm/cm2 boron dose is effective up to 2.5 volts, while at a 30 Kev, 5E12 atm/cm2 boron dose there is virtually no measurable leakage. Thus, the use of a leakage stop implant is very effective at preventing N-well leakage, even with a very narrow and shallow STI structure.

While the present invention has been described in terms of limiting leakage between a P-well device and an N-well (a PFET source/drain and an N-well) the invention is also applicable to limiting leakage between an N-well device and a P-well (an NFET source/drain and a P-well.) In the case of limiting leakage between an N-well device and a P-well the leakage stop implant is selected from the group consisting of phosphorous implanted to a dose of about 2.5E12 to 5.0E12 atm/cm2 and at energies of about 20 to 60 Kev and arsenic implanted to a dose of about 2.5E12 to 5.0E12 atm/cm2 and at energies of about 30 to 70 Kev. The concentration of N dopant at an interface formed by the bottom of said trench and said substrate would be about $3E16$ atm/cm$^3$ to $1E17$ atm/cm$^3$ and the concentration of N dopant at about 0.1 micron below the interface under the second sidewall would be about $1.0E17$ atm/cm$^3$ to $1.5E17$ atm/cm$^3$.

It should also be understood that whenever the term P or N doped substrate is used, the term is intended to include an N or a P doped epitaxial layer formed on a P or N doped substrate or an N or a P doped region formed in an N or a P doped substrate or epitaxial layer in which the P-well or N-well respectively, is formed.

The description of the embodiments of the present invention is given above for the understanding of the present invention. It will be understood that the invention is not to the particular embodiments described herein, but is capable of various modifications, rearrangements and substitutions, such as applicability to other isolation schemes such as recessed oxidation (ROX) or where the devices are diodes instead of NFETs and PFETs, which will now become apparent to those skilled in the art without departing from the scope of the invention. Therefore it is intended that the following claims cover all such modifications and changes as fall within the true spirit and scope of the invention.

What is claimed is:

1. A semiconductor device with improved leakage control, comprising:
    a P doped semiconductor substrate having a top surface;
    a STI in said substrate, said STI having a bottom, a first sidewall and an opposite second sidewall;
    a P-type leakage stop implant in said substrate under the bottom of said STI, all of said P-type leakage stop implant aligned between said second sidewall and an axis equally spaced between said first and second sidewalls; and
    an N-well in said substrate adjacent to and in contact with said first sidewall, said N-well extending under said STI and forming an upper side portion of an isolation junction with said leakage stop implant and forming a bottom and a lower side portion of said junction with dopant species in said substrate, said upper portion of said isolation junction located entirely under said STI.

2. The semiconductor device of claim 1, further comprising a P-well in said substrate adjacent to and in contact with said second sidewall, said P-well incorporated into said isolation junction.

3. The semiconductor device of claim 2, wherein said STI is 0.05 to 1 micron in depth and 0.1 to 5 microns in width.

4. The semiconductor device of claim 2, further comprising a PFET in said N-well and an NFET in said P-well.

5. The semiconductor device of claim 1, wherein said leakage stop implant extends under said STI from said second sidewall toward said first sidewall a distance equal to 10 to 40% of the width of said STI.

6. The semiconductor device of claim 1, wherein the concentration of P dopant at an interface formed by the bottom of said STI and said substrate is $3E16$ atm/cm$^3$ to $1E17$ atm/cm$^3$.

7. The semiconductor device of claim 6, wherein the concentration of P dopant at about 0.1 micron below said interface under said second sidewall is $1.0E17$ atm/cm$^3$ to $1.5E17$ atm/cm$^3$.

8. The semiconductor device of claim 1, further comprising spacers on said first and second sidewalls of and contained within said STI.

9. The semiconductor device of claim 1, wherein said STI is filled with TEOS or HDP oxide.

10. The semiconductor device of claim 9, further including a liner on said bottom, said first sidewall and said second sidewall of said STI.

11. The semiconductor device of claim 10, wherein said liner is 10 to 30 nm thick thermal oxide.

12. The semiconductor device of claim 10, further comprising spacers on said liner over said first and second sidewalls of and contained within said STI.

13. The semiconductor device of claim 1, wherein:
    said isolation junction contacts said bottom of said STI a first distance from said second sidewall of said isolation junction;
    said isolation junction extends from said second sidewall a second distance at a first depth below said bottom of said STI;
    said isolation junction extends from said second sidewall a third distance at a second depth below said bottom of said STI;
    said isolation junction extends from said second sidewall a fourth distance at a third depth below said bottom of said STI;
    said first depth less than said second depth, said second depth less than said third depth; and said first and third distances greater than said second distance and first, second and third distances greater than said fourth distance.

14. A semiconductor device with improved leakage control, comprising:

an N doped semiconductor substrate having a top surface;

a STI in said substrate, said STI having a bottom, a first sidewall and an opposite second sidewall;

an N-type leakage stop implant in said substrate under the bottom of said STI, all of said N-type leakage stop implant aligned between said second sidewall and an axis equally spaced between said first and second sidewalls; and a P-well in said substrate adjacent to and in contact with said first sidewall, said P-well extending under said STI and forming an upper side portion of an isolation junction with said leakage stop implant and forming a bottom and a lower side portion of said junction with dopant species in said substrate, said upper portion of said isolation junction located entirely under said STI.

15. The semiconductor device of claim 14, further comprising an N-well in said substrate adjacent to and in contact with said second sidewall, said N-well incorporated into said isolation junction.

16. The semiconductor device of claim 15, wherein said STI is 0.05 to 1 micron in depth and 0.1 to 5 microns in width.

17. The semiconductor device of claim 15, further comprising a NFET in said P-well and a PFET in said N-well.

18. The semiconductor device of claim 14, wherein said leakage stop implant extends under said STI from said second sidewall toward said first sidewall a distance equal to 10 to 40% of the width of said STI.

19. The semiconductor device of claim 14, wherein the concentration of N dopant at an interface formed by the bottom of said STI and said substrate is 3E16 atm/cm$_3$ to1E17 atm/cm$^3$.

20. The semiconductor device of claim 19, wherein the concentration of N dopant at about 0.1 micron below said interface under said second sidewall is 1.0E17 atm/cm$^3$ to 1.5E17 atm/cm$^3$.

21. The semiconductor device of claim 14, further comprising spacers on said first and second sidewalls of and contained within said STI.

22. The semiconductor device of claim 14, wherein said STI is filled with TEOS or HDP oxide.

23. The semiconductor device of claim 22, further including a liner on said bottom, said first sidewall and said second sidewall of said STI.

24. The semiconductor device of claim 23, wherein said liner is 10 to 30 nm thick thermal oxide.

25. The semiconductor device of claim 23, further comprising spacers on said liner over said first and second sidewalls of and contained within said STI.

26. The semiconductor device of claim 14, wherein:

said isolation junction contacts said bottom of said STI a first from said second sidewall or said isolation junction;

said isolation junction extends from said second sidewall a second distance at a first depth below said bottom of said STI;

said isolation junction extends from said second sidewall a third distance at a second depth below said bottom of said STI;

said isolation junction extends form said second sidewall a fourth distance at a third depth below said bottom or said STI;

said first depth loss than said second depth, said second depth loss than said third depth; and said first and third distances greater than, said second distance and first, second and third distances greater than said fourth distance.

* * * * *